United States Patent
Lin et al.

(10) Patent No.: US 9,954,166 B1
(45) Date of Patent: Apr. 24, 2018

(54) EMBEDDED MEMORY DEVICE WITH A COMPOSITE TOP ELECTRODE

(71) Applicant: Taiwan Semiconductor Manufacturing Co., Ltd., Hsin-Chu (TW)

(72) Inventors: Hsing-Lien Lin, Hsin-Chu (TW); Hai-Dang Trinh, Hsinchu (TW); Yao-Wen Chang, Taipei (TW)

(73) Assignee: Taiwan Semiconductor Manufacturing Co., Ltd., Hsu-Chu (TW)

( * ) Notice: Subject to any disclaimer, the term of this patent is extended or adjusted under 35 U.S.C. 154(b) by 0 days.

(21) Appl. No.: 15/362,153

(22) Filed: Nov. 28, 2016

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 45/124* (2013.01); *H01L 45/1608* (2013.01)

(58) Field of Classification Search
CPC .................................................. H01L 45/1253
See application file for complete search history.

(56) References Cited

U.S. PATENT DOCUMENTS

| | | | |
|---|---|---|---|
| 6,750,500 B1 * | 6/2004 | Agarwal | H01L 21/28568 257/301 |
| 9,257,642 B1 * | 2/2016 | Chang | H01L 45/1253 |
| 9,685,561 B2 * | 6/2017 | Ichijo | H01L 29/4908 |
| 2004/0029377 A1 * | 2/2004 | Lee | H01L 21/76846 438/637 |
| 2011/0049654 A1 * | 3/2011 | Li | H01L 43/08 257/421 |
| 2012/0145986 A1 * | 6/2012 | Yasutake | H01L 27/2409 257/4 |
| 2014/0268990 A1 * | 9/2014 | Hong | G11C 13/0004 365/148 |
| 2014/0291847 A1 * | 10/2014 | Zhang | H01L 23/53261 257/751 |
| 2014/0319514 A1 * | 10/2014 | Noda | H01L 29/7869 257/43 |

(Continued)

OTHER PUBLICATIONS

A. Chen et al., Non-Volatile Resistive Switching for Advanced Memory Applications, Dec. 2005, IEDM Technical Digest. pp. 746-749.*

*Primary Examiner* — Victoria K Hall
(74) *Attorney, Agent, or Firm* — Eschweiler & Potashnik, LLC

(57) ABSTRACT

A memory cell with a composite top electrode is provided. A bottom electrode is disposed over a substrate. A switching dielectric having a variable resistance is disposed over the bottom electrode. A capping layer is disposed over the switching dielectric. A composite top electrode is disposed over and abutting the capping layer. The composite top electrode comprises a tantalum nitride (TaN) layer and a titanium nitride (TiN) film disposed directly on the tantalum nitride layer. By having the disclosed composite top electrode, an interfacial oxidized layer is eliminated or less formed when exposing the composite top electrode for top electrode via formation, thereby improving RC properties between the top electrode and the top electrode via. A method for manufacturing the memory cell is also provided.

20 Claims, 7 Drawing Sheets

(56) References Cited

U.S. PATENT DOCUMENTS

| | | | |
|---|---|---|---|
| 2015/0194602 A1* | 7/2015 | Liao | H01L 45/146 257/4 |
| 2015/0287917 A1* | 10/2015 | Dang | H01L 45/1641 257/4 |
| 2015/0295172 A1* | 10/2015 | Sung | H01L 45/1253 257/2 |
| 2016/0020390 A1 | 1/2016 | Chang et al. | |
| 2017/0148849 A1* | 5/2017 | Chuang | H01L 27/228 |
| 2017/0179033 A1* | 6/2017 | West | H01L 21/76814 |
| 2017/0271269 A1* | 9/2017 | West | H01L 23/53238 |
| 2017/0301728 A1* | 10/2017 | Chuang | H01L 27/228 |

* cited by examiner

EMBEDDED MEMORY DEVICE WITH A COMPOSITE TOP ELECTRODE

BACKGROUND

Many modern day electronic devices contain electronic memory. Electronic memory may be volatile memory or non-volatile memory. Non-volatile memory is able to store data in the absence of power, whereas volatile memory is not. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
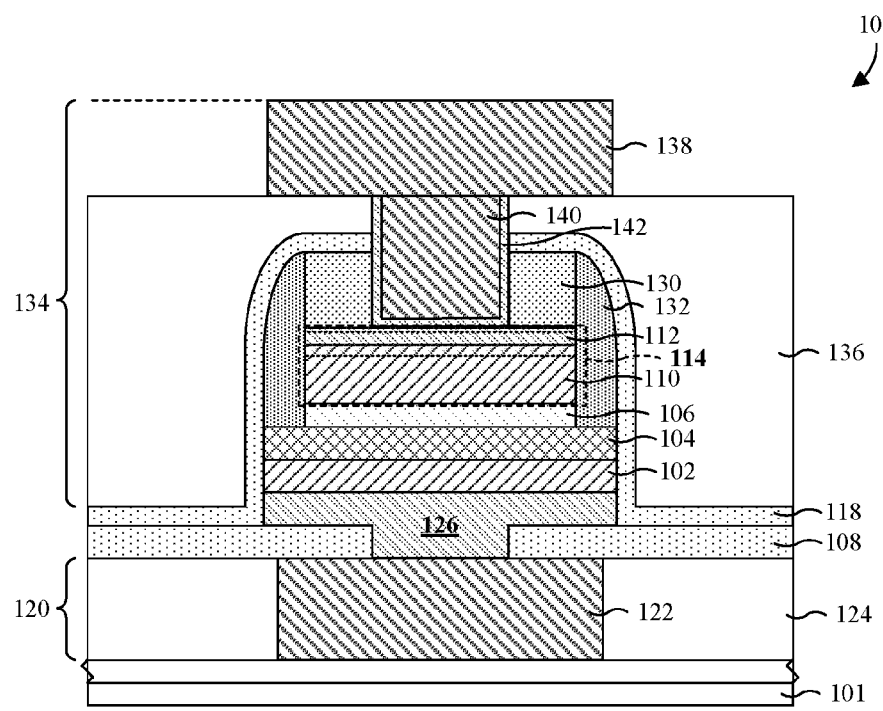
FIG. 1 illustrates a cross-sectional view of some embodiments of a memory cell with a composite top electrode.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A trend in semiconductor manufacturing is to integrate different types of devices on a single substrate to achieve higher integration. One example is a substrate having a logic region, in which logic devices are formed, and a memory region, in which memory devices are embedded. A memory device includes a pair of electrodes separated by a resistance switching element. Depending on a voltage applied to the pair of electrodes, the resistance switching element will undergo a reversible change between a high resistance state associated with a first data state (e.g., a '0' or 'RESET') and a low resistance state associated with a second data state (e.g., a '1' or 'SET'). The memory device is compatible with complementary metal-oxide-semiconductor (CMOS) logic fabrication processes and can be inserted between two interconnect metal layers. The memory device is coupled to these two interconnect metal layers for data storage and transmission. A top electrode of a memory cell is coupled to an upper interconnect metal layer through a top electrode via, known as TEVA. The process to form the TEVA introduces contact challenges: the top electrode and the TEVA may not perfectly contact with each other which may result a large contact resistance and an increased resistance-capacitance delay. In more detail, after forming the top electrode of a memory cell, a dielectric layer is formed over the top electrode followed by a patterning process to form an opening through the dielectric layer for TEVA filling. The top electrode is exposed to the air before forming the TEVA therein. Therefore, a native interfacial oxide layer is formed between the top electrode and the TEVA during the air exposure, which introduces the contact challenges.

The present application is related to an improved memory device having a composite top electrode which eliminates/suppresses the interfacial/oxidized layer during the top electrode exposure, and corresponding manufacturing methods. Thereby, RC properties of the memory device could be improved significantly. In some embodiments, a memory cell comprises a bottom electrode disposed over a substrate, and a switching dielectric having a variable resistance and disposed over the bottom electrode. A capping layer is disposed over the switching dielectric. A composite top electrode is disposed over and abutting the capping layer. The composite top electrode comprises a tantalum nitride (TaN) layer and a titanium nitride (TiN) film disposed directly on the tantalum nitride layer. By having the TiN film as an uppermost portion of the composite top electrode, an interfacial/oxidized layer is eliminated or reduced when exposing the top electrode for TEVA formation, thereby improving RC properties between the top electrode and the TEVA.

FIG. 1 illustrates a cross-sectional view of a memory cell 100 with a composite top electrode according to some embodiments. As shown in FIG. 1, the memory cell 100 comprises a back-end-of-line (BEOL) metallization stack having a lower interconnect structure 120 and an upper interconnect structure 134 arranged over a semiconductor substrate 101. The lower interconnect structure 120 includes one or more bottom metallization lines 122 stacked within a bottom interlayer dielectric (ILD) layer 124. The bottom ILD layer 124 may be, for example, an oxide, a low-k dielectric or an extreme low-k dielectric (i.e., a dielectric with a dielectric constant k less than about 2), and the bottom metallization lines 122 may be, for example, a metal, such as copper. The upper interconnect structure 134 includes a top ILD layer 136 and a top metallization layer 138 overlying the top ILD layer 136. The top ILD layer 136 may be, for example, a low-k dielectric or an extreme low-k dielectric, and the top metallization layer 138 may be, for example, a metal, such as copper.

The memory cell 100 comprises a bottom electrode 102 arranged over the lower interconnect structure 120. The bottom electrode 102 may be a conductive material, such as titanium nitride. The bottom electrode 102 may also comprise, for example, tantalum nitride, platinum, iridium, tungsten, ruthenium, or the like. In some embodiments, the bottom electrode 102 is electrically coupled to the bottom metallization line 122 of the lower interconnect structure 120 through a bottom electrode via 126 arranged between the bottom electrode 102 and the bottom metallization lines 122. The bottom electrode via 126 may be, for example, a conductive material, such as platinum, iridium, ruthenium or tungsten and may function as a diffusion barrier layer to prevent material from diffusing between the bottom metallization lines 122 and the bottom electrode 102. The bottom electrode via 126 may include a top region and a bottom region. The bottom region includes a smaller footprint than the top region and extends vertically down from the top region to the lower interconnect structure 120. The memory cell 100 further comprises a switching dielectric 104 arranged over the bottom electrode 102. The switching dielectric 104 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements. A capping layer 106 is arranged over the switching dielectric 104. The capping layer 106 may comprise one or more metal layers, for example, a titanium layer. The capping layer 106 may also comprise zirconium, lanthanum, tantalum, aluminum, tungsten, ruthenium, platinum, nickel, copper, gold, or the like.

A composite top electrode 114 is arranged over and abuts the capping layer 106. In some embodiments, a thickness of the composite top electrode 114 is about greater than 2 to 3 times of a thickness of the switching dielectric 104. In some embodiments, the composite top electrode 114 is electrically coupled to the top metallization layer 138 of the upper interconnect structure 134 through a top electrode via 140 arranged between the composite top electrode 114 and the top metallization layer 138. The top electrode via 140 may be, for example, a conductive material, such as such as copper, aluminum, or tungsten. A glue layer 142 may surround bottom and sidewall surfaces of the top electrode via 140 and may comprise tantalum or tantalum nitride. The composite top electrode 114 comprises a lower top electrode layer 110 and an upper top electrode layer 112. Besides functioning as a top electrode collectively, the lower top electrode layer 110 and the upper top electrode layer 112 also respectively function as different barrier layers. The upper top electrode layer 112 prevents formation of an interfacial layer or an oxidation layer between the composite top electrode 114 and the top electrode via 140. The lower top electrode layer 110 prevents diffusion of metal materials of the top electrode via 140 to the underlying switching dielectric 104. In some embodiments, the lower top electrode layer 110 is a tantalum nitride (TaN) layer, and the upper top electrode layer 112 is a titanium nitride (TiN) film disposed directly on the TaN layer with a nitrogen concentration greater than in the TaN layer. For example, the lower top electrode layer 110 may have a molar ratio of nitrogen and tantalum in a range of from about 0.3 to 1, preferably 0.3 to 0.5. The upper top electrode layer 112 may have a molar ratio of nitrogen and titanium substantially equals to 1. In some further embodiments, the lower top electrode layer 110 may have a major portion having a molar ratio of nitrogen and tantalum being greater than 0.3 and a small upper portion (shown as being separated from the major portion by dotted line in FIG. 1) that has a gradually decreasing molar ratio of nitrogen and tantalum to substantially zero at a top surface, as a result of manufacture.

In some embodiments, the memory cell 100 may further comprise a hard mask 130 arranged over the composite top electrode 114. The hard mask 130 is a residual material from the manufacture of the memory cell 100. Further, the hard mask 130 may be, for example, a dielectric, such as silicon dioxide or silicon nitride. In some embodiments, a sidewall spacer 132 is disposed surrounding and along sidewalls of the capping layer 106, the composite top electrode 114, and the hard mask 130. The sidewall spacer 132 prevents leakage between the composite top and bottom electrodes 114, 102 and is used during the manufacture of the memory cell 100 to define a foot print of the bottom electrode 102, the switching dielectric 104, and the bottom electrode via 126. The sidewall spacer 132 may be, for example, silicon nitride or a multilayer oxide-nitride-oxide film. Therefore, sidewalls of the bottom electrode 102, the switching dielectric 104, and the bottom electrode via 126 may be vertically aligned. The sidewalls of the capping layer 106, the composite top electrode 114, and the hard mask 130 may also be vertically aligned and recessed back from that of the bottom electrode 102. In some embodiments, the memory cell 100 further comprises a lower dielectric layer 108 surrounding the bottom region of the bottom electrode via 126 and an upper dielectric layer 118 disposed over the lower dielectric layer 108. The upper dielectric layer 118 continuously extends along the sidewalls of the bottom electrode 102, the switching dielectric 104, the bottom electrode via 126, and the sidewall spacer 132, and overlies the hard mask 130. In some embodiments, the lower dielectric layer 108 and the upper dielectric layer 118 may comprise the same dielectric material as one another or different dielectric materials from one another, and may be made up of silicon carbide (SiC), silicon nitride ($SiN_x$), or one or more layers of composite dielectric films, for example.

During operation of the memory cell 100, voltages are applied between the composite top and bottom electrodes 114, 102. A voltage may be applied between the composite top and bottom electrodes 114, 102 to read, set, or erase the memory cell 100. For example, the voltage may be applied to trigger reactions between the switching dielectric 104 and the capping layer 106. The reactions between the switching dielectric 104 and the capping layer 106 extract or push oxygen from the switching dielectric 104 and form or break one or more conductive filaments. Thus the memory cell 100 can have a variable resistance in a comparatively low or high resistance state to stand for low or high bit status, for example.

Figure 2:
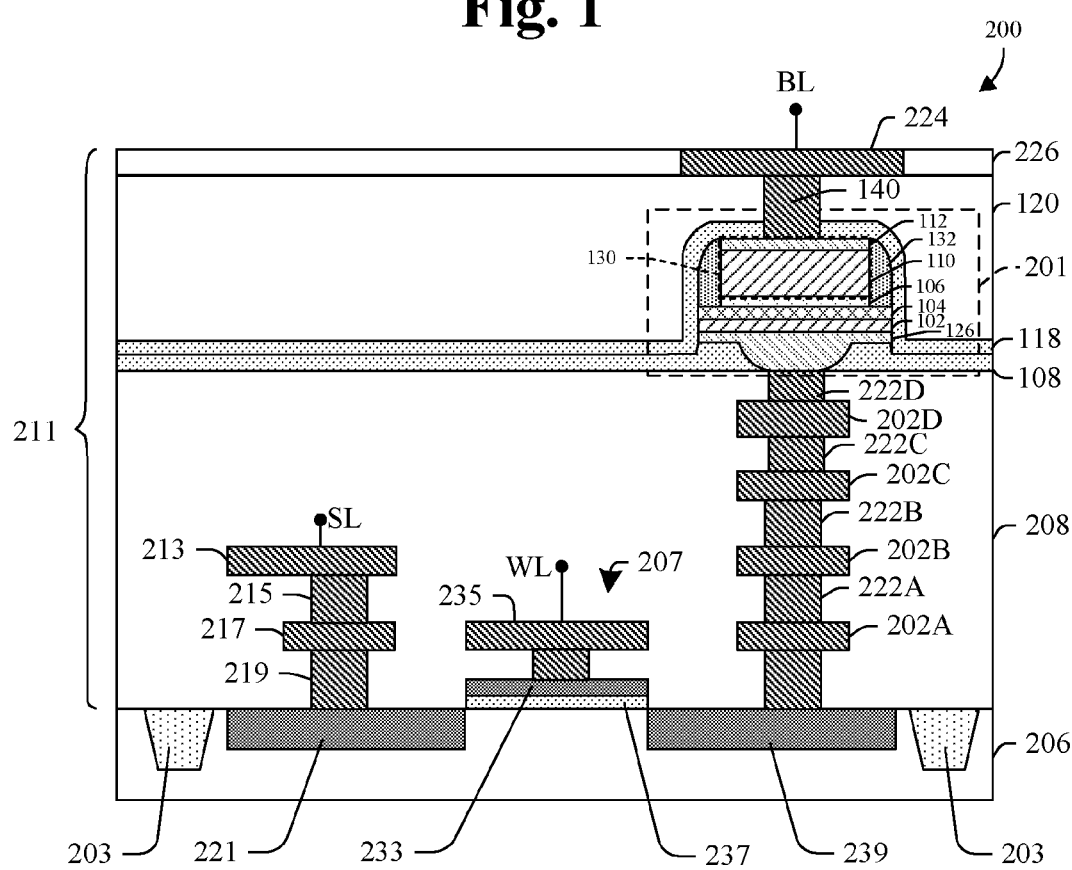
FIG. 2 illustrates a cross-sectional view of some embodiments of an integrated circuit with the memory cell of FIG. 1.

FIG. 2 illustrates a cross-sectional view of an integrated circuit device 200 including a memory cell 201, such as the memory cell 100 of FIG. 1, according to some additional embodiments. As shown in FIG. 2, the memory cell 201 can be disposed over a semiconductor substrate 206 on which a transistor 207 is arranged between isolation regions 203. The transistor 207 includes a source region 221, a drain region 239, a gate electrode 233, and a gate dielectric 237. The memory cell 201 is arranged in an interconnect structure 211 made up of alternating metal and dielectric layers which are horizontally layered over one another and which are coupled to one another by vias. A source line 213 (SL) for operating the memory cell 201 is connected to the source region 221 through a contact 219, a first metal interconnect line 217, and a first metal via 215, which are disposed within one or more ILD layers 208. A word line 235 (WL) for addressing the memory cell 201 is formed and electrically coupled to the gate electrode 233. A bottom electrode 102 of the memory cell 201 is connected to the drain region 239 through a bottom electrode via 126; one or more of first, second, third, and fourth metallization lines 202A-202D; and metal vias 222A-222D formed between the metallization lines 202A-202D. A top electrode via 140 connects a composite top electrode 114 of the memory cell 201 to a bit line corresponding to a fifth metal interconnect layer 224 which is disposed within an ILD layer 226. A switching dielectric 104 is disposed on the bottom electrode 102, and has a sidewall vertically aligned with that of the bottom electrode 102 and the bottom electrode via 126. A capping layer 106 is disposed between the switching dielectric 104 and the composite top electrode 114, has a sidewall vertically aligned with that of the composite top electrode 114. A sidewall spacer 132 is disposed on the switching dielectric 104 and along sidewalls of the capping layer 106 and the composite top electrode 114. A lower dielectric layer 108 surrounds the bottom electrode via 126 and an upper dielectric layer 118 abuts the lower dielectric layer 108 and covers sidewalls of the bottom electrode 102, the switching dielectric 104, and the sidewall spacer 132.

The composite top electrode 114 includes a lower top electrode layer 110 and an upper top electrode layer 112 arranged directly on the lower top electrode layer 110. In some embodiments, the lower top electrode layer 110 is a tantalum nitride (TaN) layer with a molar ratio of nitrogen and tantalum in a range of from about 0.3 to 1, preferably from about 0.3 to 0.5. The TaN layer prevents diffusion of metal materials of the top electrode via 140 to the switching dielectric 104. In some embodiments, the upper top electrode layer 112 is a titanium nitride (TiN) film with a molar ratio of nitrogen and titanium substantially equals to 1 or greater than 1. The high nitrogen TiN film prevents formation of an interfacial layer or an oxidation layer between the composite top electrode 114 and the top electrode via 140.

FIGS. 3-12 illustrate some embodiments of cross-sectional views showing a method of forming an integrated circuit device.

Figure 3:
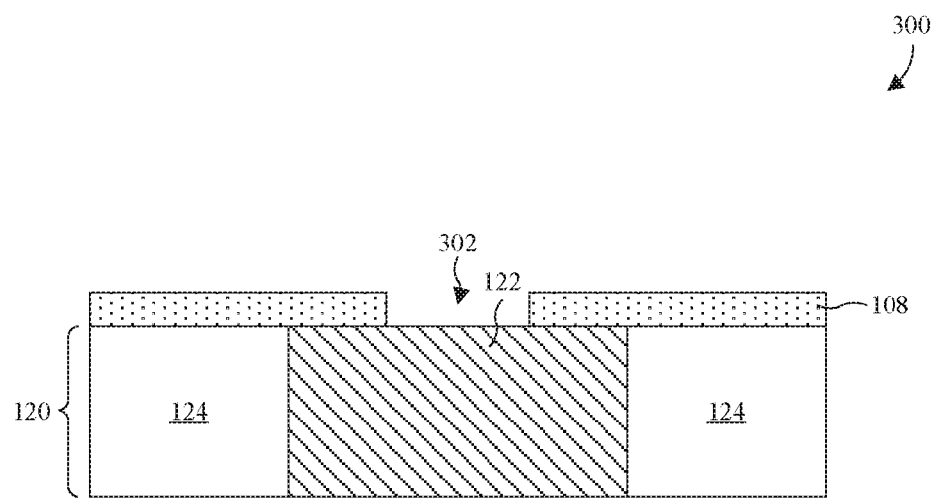
FIGS. 3-12 illustrate a series of cross-sectional views of some embodiments of an integrated circuit at various stages of manufacture, the integrated circuit including a memory cell.

As shown in cross-sectional view 300 of FIG. 3, a bottom via opening 302 is formed within a lower dielectric layer 108 overlying a lower interconnect structure 120. The lower interconnect structure 120 includes a bottom metallization line 122 laterally surrounded by a bottom ILD layer 124. The bottom ILD layer 124 may be, for example, an extreme low-k dielectric, and the bottom metallization line 122 may be, for example, a metal, such as copper. The lower dielectric layer 108 is formed over the lower interconnect structure 120 with the bottom via opening 302 exposing the bottom metallization line 122. The lower dielectric layer 108 may be, for example, a dielectric, such as silicon dioxide or silicon nitride. The process for forming the bottom via opening 302 may include depositing the lower dielectric layer 108 over the lower interconnect structure 120 followed by a photolithography process. A photoresist layer may be formed over the lower dielectric layer 108 and masking regions of lower dielectric layer 108 corresponding to the bottom via opening 302 to be formed. Then, one or more etchants selective of the lower dielectric layer 108 may be applied according to the photoresist layer. After applying the one or more etchants, the photoresist layer may be removed.

Figure 4:
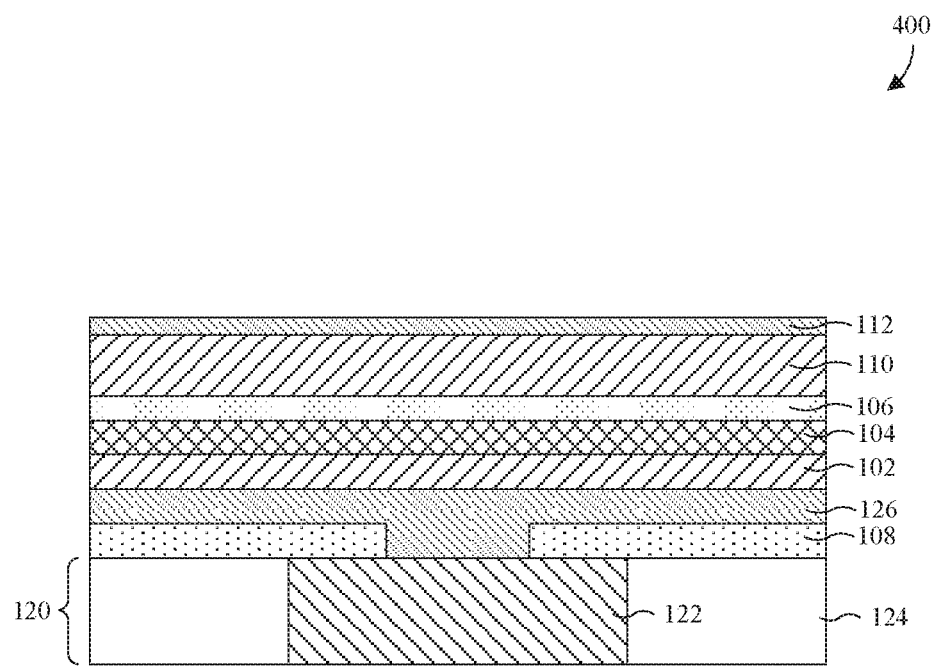

As shown in cross-sectional view 400 of FIG. 4, a multi-layer stack is deposited over the lower dielectric layer 108 by a series of vapor deposition techniques (e.g., physical vapor deposition, chemical vapor deposition, etc.). A bottom electrode via 126 is firstly formed over the lower dielectric layer 108 and filling the bottom via opening 302. The bottom electrode via 126 may be, for example, formed of a conductive material, such as polysilicon, titanium nitride, tantalum nitride, platinum, gold, iridium, ruthenium, tungsten, or the like. For example, the bottom electrode via 126 may be a titanium nitride layer formed by an atomic layer deposition (ALD) process, followed by a planarization process. Then, layers of a bottom electrode 102, a switching dielectric 104, a capping layer 106, a lower top electrode layer 110 and an upper top electrode layer 112 are formed over the bottom electrode via 126 and the lower dielectric layer 108 in succession. These layers can be formed by a series of vapor deposition techniques (e.g., physical vapor deposition, chemical vapor deposition, etc.). In some embodiments, the bottom electrode 102 may comprise a metal nitride (e.g., titanium nitride (TiN), tantalum nitride (TaN), or the like) and/or a metal (e.g., titanium (Ti), tantalum (Ta), or the like). In some embodiments, the switching dielectric 104 may comprise a metal oxide composite such as hafnium aluminum oxide (HfAlO$_x$), zirconium oxide (ZrO$_x$), aluminum oxide (AlO$_x$), nickel oxide (NiO$_x$), tantalum oxide (TaO$_x$), or titanium oxide (TiO$_x$). The capping layer 106 may comprise titanium (Ti), hafnium (Hf), platinum (Pt), ruthenium (Ru), and/or aluminum (Al).

In some embodiments, the lower top electrode layer 110 and the upper top electrode layer 112 are formed by a physical vapor deposition process. For example, the lower top electrode layer 110 can be formed by depositing a TaN layer having a thickness in a range of from about 100 Å to 200 Å, and the upper top electrode layer 112 can be formed by depositing a TiN layer having a thickness in a range of from about 20 Å to 50 Å. Corresponding tantalum and titanium targets are used for sputtering with a nitrogen gas applied at different flow rates: the upper top electrode layer 112 is formed of more nitrogen than lower top electrode layer 110 such that it is more non-reactive to the air and protects itself from oxidation when exposed. In some embodiments, the deposition processes of the lower top electrode layer 110 and the upper top electrode layer 112 can be performed in-situ, i.e., within a same deposition chamber. In some embodiments, the sputtering process is continued for a short time after the nitrogen gas source is cut off in order to clean the tantalum and titanium targets. As a result, a very top portion of the lower top electrode layer 110 and/or the upper top electrode layer 112 may have a gradually decreasing nitrogen molar ratio which may even decrease to zero at their top surfaces. In some embodiments, the nitrogen molar ratio may decrease monotonically, or may follow a Gaussian distribution type, or some other distribution type.

Figure 5:
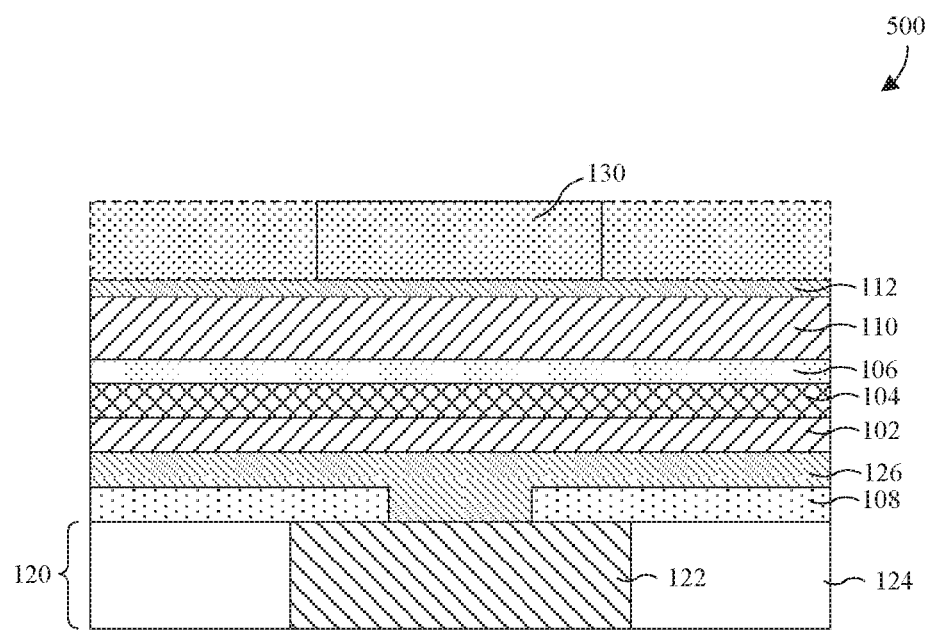

As shown in cross-sectional view 500 of FIG. 5, in some embodiments, a hard mask 130 may be formed on the composite top electrode 114 to facilitate the patterning of the memory cell. The hard mask 130 can be formed by depositing a dielectric layer (shown by dashed-line), such as silicon dioxide or silicon nitride, followed by a photolithography process for patterning.

Figure 6:
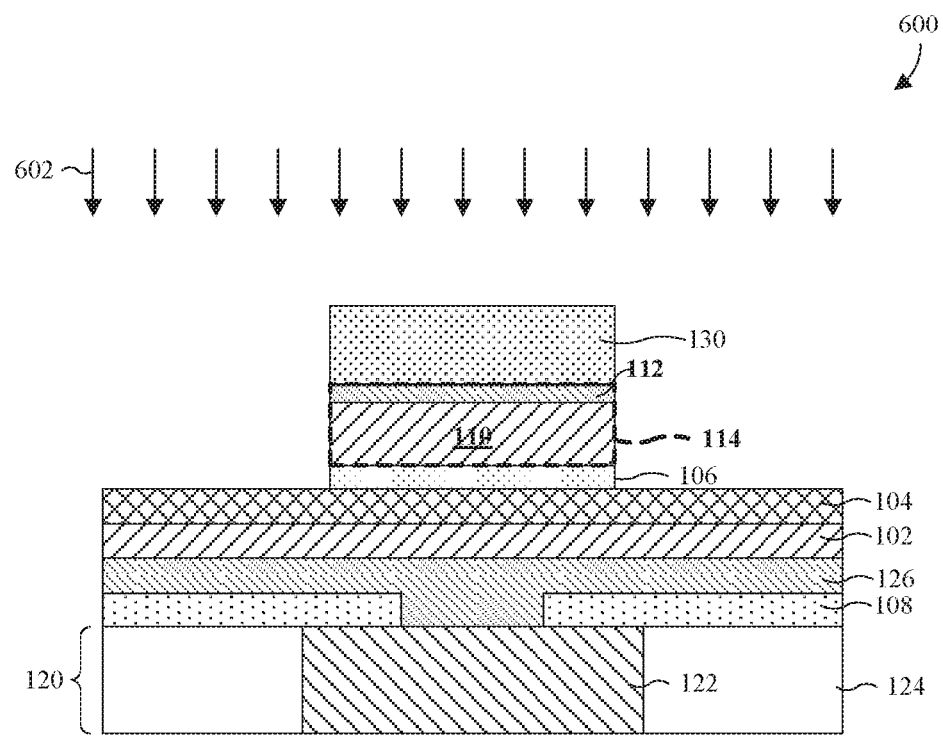

As shown in cross-sectional view 600 of FIG. 6, the upper top electrode layer 112, the lower top electrode layer 110, and the capping layer 106 are patterned according to the hard mask 130 through a first etch 602. The first etch 602 can comprise a dry etch such as a plasma etching process that may have an etchant chemistry including $CF_4$, $CH_2F_2$, $Cl_2$, $BCl_3$ and/or other chemicals. The upper top electrode layer 112 and the lower top electrode layer 110 are patterned to collectively form a composite top electrode 114.

Figure 7:
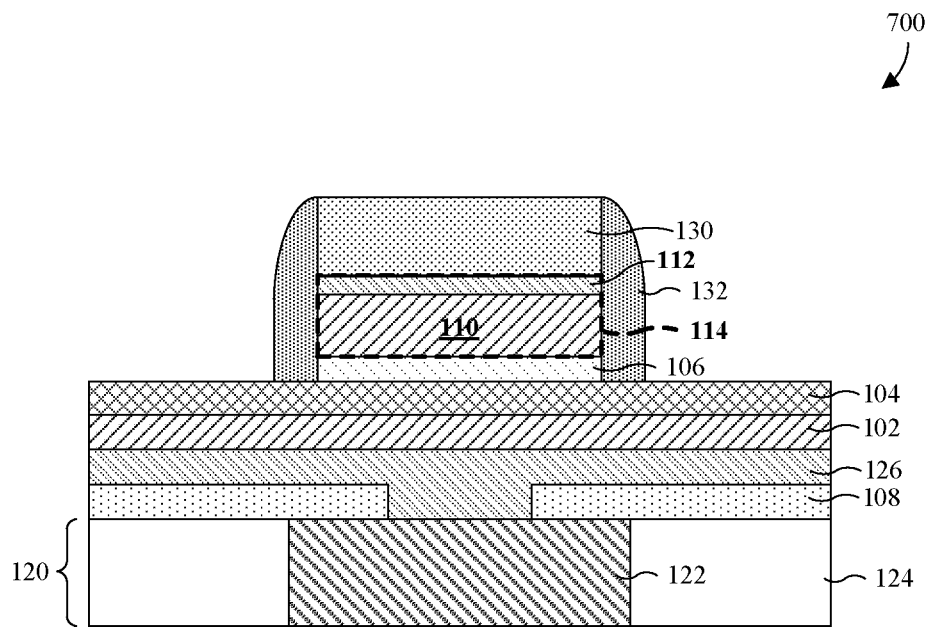

As shown in cross-sectional view 700 of FIG. 7, a sidewall spacer 132 is formed over the switching dielectric 104, and lining sidewalls of the capping layer 106, the composite top electrode 114, and the hard mask 130. The sidewall spacer 132 extends from about even with an upper surface of the switching dielectric 104 to about even with an upper surface of the hard mask 130. The sidewall spacer 132 may be, for example, formed of silicon nitride or a multi-layer oxide-nitride-oxide film having a nitride layer sandwiched between a pair of oxide layers. The process for forming the sidewall spacer 132 may include depositing a conformal, intermediate layer over the switching dielectric 104, and lining the capping layer 106, the composite top electrode 114, and the hard mask 130. The intermediate layer may be deposited using a conformal deposition technique, such as chemical vapor deposition (CVD). With the intermediate layer deposited, an etchant may be applied to the intermediate layer for the approximate time it takes the etchant to etch through the thickness of the intermediate layer. The etchant removes lateral stretches of the intermediate layer, thereby resulting in the sidewall spacer 132.

Figure 8:
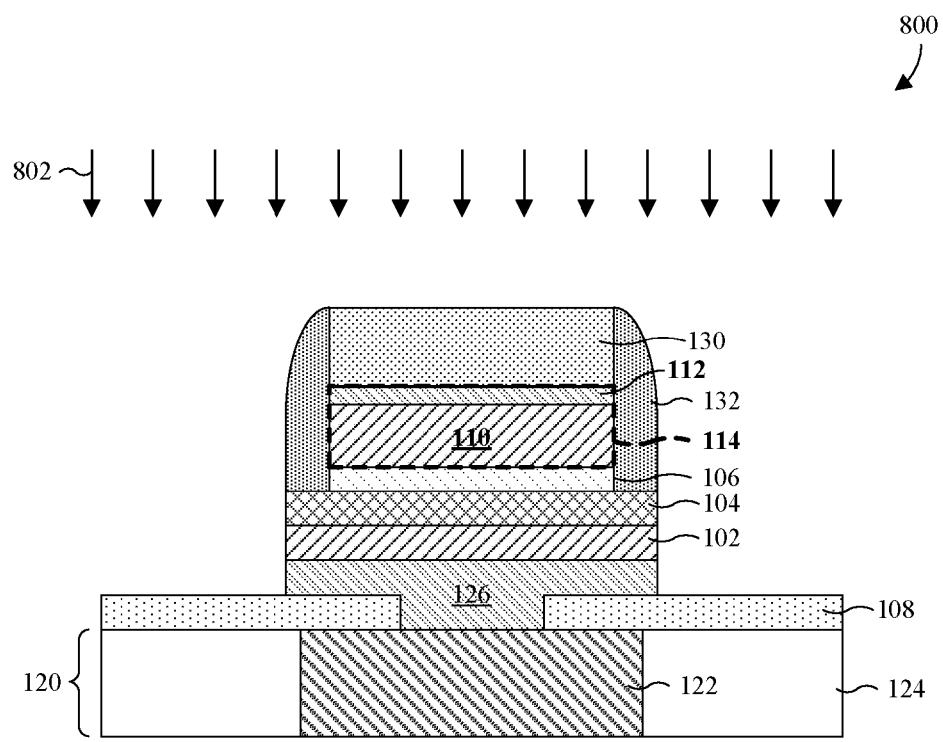

As shown in cross-sectional view 800 of FIG. 8, a second etch 802 is performed to pattern the switching dielectric 104, the bottom electrode 102, and the bottom electrode via 126 according to the sidewall spacer 132 and the hard mask 130. The second etch 802 can comprise a dry etch such as a plasma etching process that may have an etchant chemistry including $CF_4$, $CH_2F_2$, $Cl_2$, $BCl_3$ and/or other chemicals.

Figure 9:
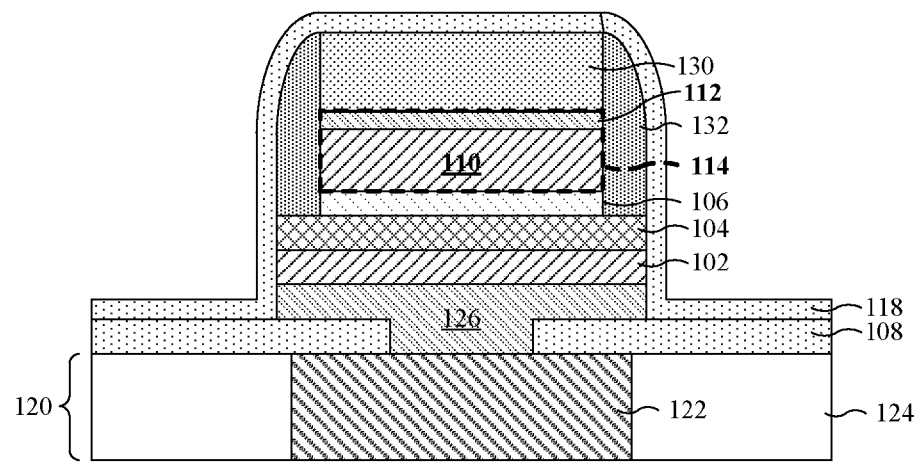

As shown in cross-sectional view 900 of FIG. 9, an upper dielectric layer 118 is formed over the lower dielectric layer 108, and lining the bottom electrode via 126, the bottom electrode 102, the switching dielectric 104, the sidewall spacer 132, and the hard mask 130. In an alternative embodiment, the bottom electrode via 126 can be planarized to have an upper surface laterally aligned with that of the lower dielectric layer 108. In this case, the upper dielectric layer 118 has a bottom surface laterally aligned with that of the bottom electrode 102. The upper dielectric layer 118 may be, for example, formed of a dielectric material, such as silicon dioxide or silicon nitride. Further, the upper dielectric layer 118 may be, for example, formed using a conformal deposition technique.

Figure 10:
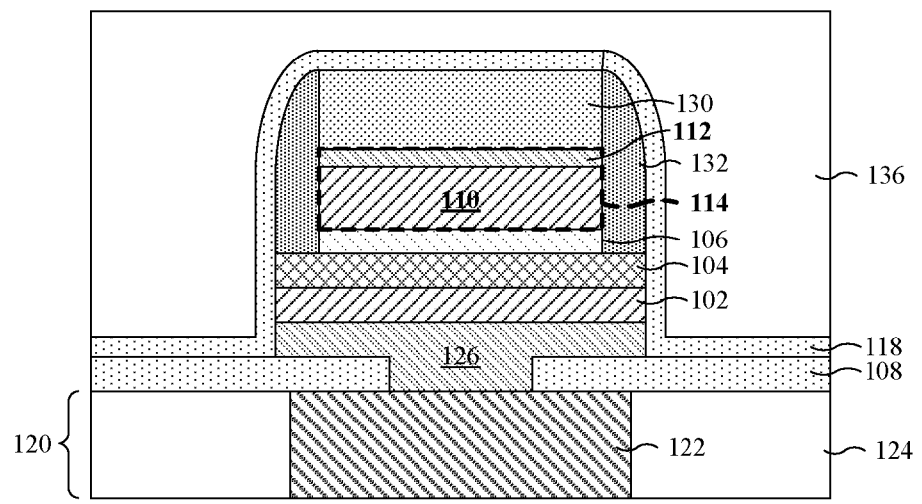

As shown in cross-sectional view 1000 of FIG. 10, a top ILD layer 136 is formed over and surrounding the upper dielectric layer 118. The top ILD layer 136 may be, for example, a low-k or an extreme low-k dielectric. In some embodiments, the process for forming the top ILD layer 136 includes depositing an intermediate ILD layer and performing a chemical mechanical polish (CMP) into the intermediate ILD layer to planarize the top surface of the intermediate ILD layer.

Figure 11:
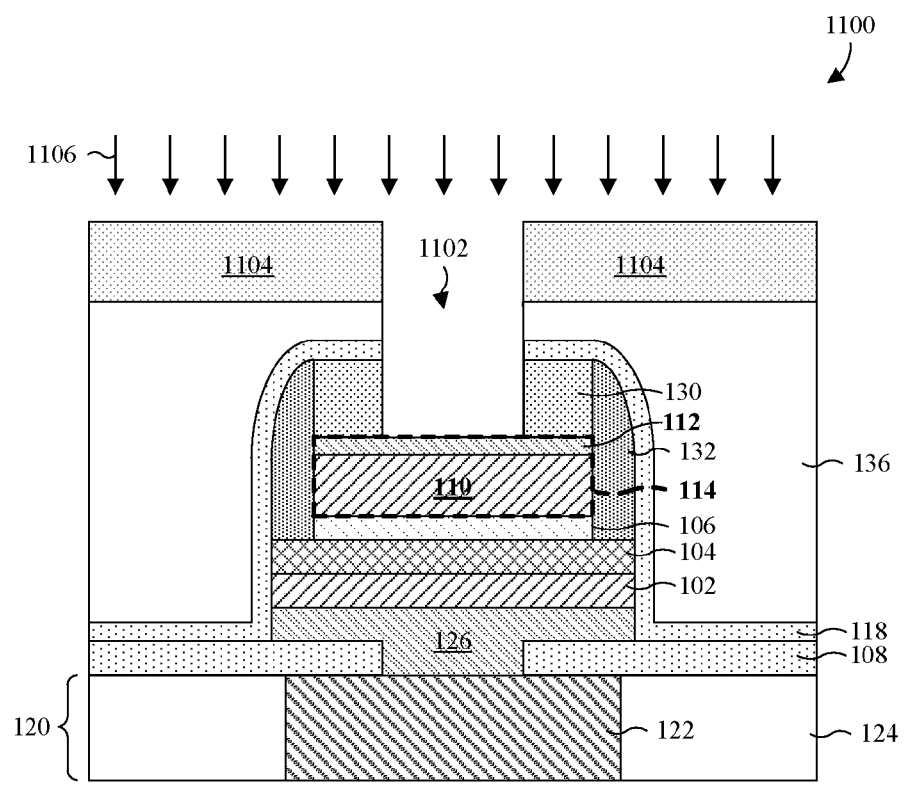

As shown in cross-sectional view 1100 of FIG. 11, a third etch 1106 is performed to form a top electrode via opening 1102 through the top ILD layer 136, the upper dielectric layer 118, and the hard mask 130 and reach on the composite top electrode 114. In some embodiments, the process for performing the third etch 1106 may include forming and patterning a photoresist or hard masking layer 1104 over the top ILD layer 136 and patterning to form the top electrode via opening 1102 according to the photoresist or hard masking layer 1104. Thereafter, the photoresist or hard masking layer 1104 may be removed. Since the exposed upper top electrode layer 112 of the composite top electrode 114 is made of metal or metal composite material (e.g. TiN layer having a molar ratio of Ti and N substantially equal to 1) that is less reactive to the air (compared to the lower top electrode layer 110), thinner interfacial layer would be formed at a top surface thereof during and after the formation of the top electrode via opening 1102.

Figure 12:
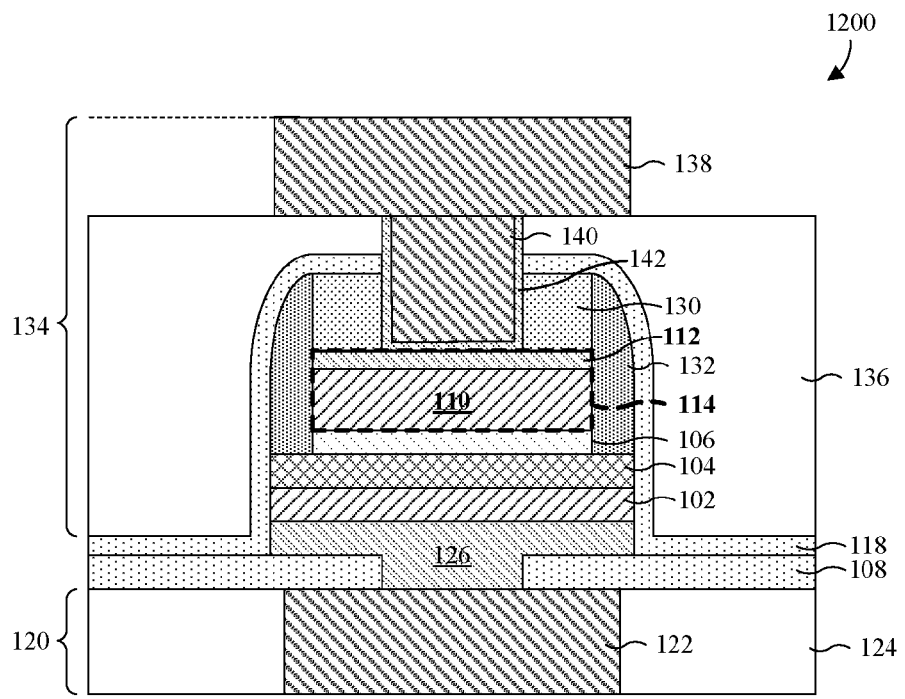

As shown in cross-sectional view 1200 of FIG. 12, a conductive layer is formed filling the top electrode via opening 1102 to form a top electrode via 140, and overhanging the top ILD layer 136 to form a top metallization layer 138. The conductive layer may be, for example, a metal, such as copper or tungsten. The process for forming the conductive layer may include depositing an intermediate conductive layer over the remaining top ILD layer 136 and filling the top electrode via opening 1102. Photolithography may then be used to pattern the conductive layer. In some embodiments, prior to filling the conductive layer, a glue layer 142 may be formed surrounding bottom and sidewall surfaces of the top electrode via 140 and may comprise tantalum or tantalum nitride, to facilitate the contact between the top electrode via 140 and the upper top electrode layer 112.

Figure 13:
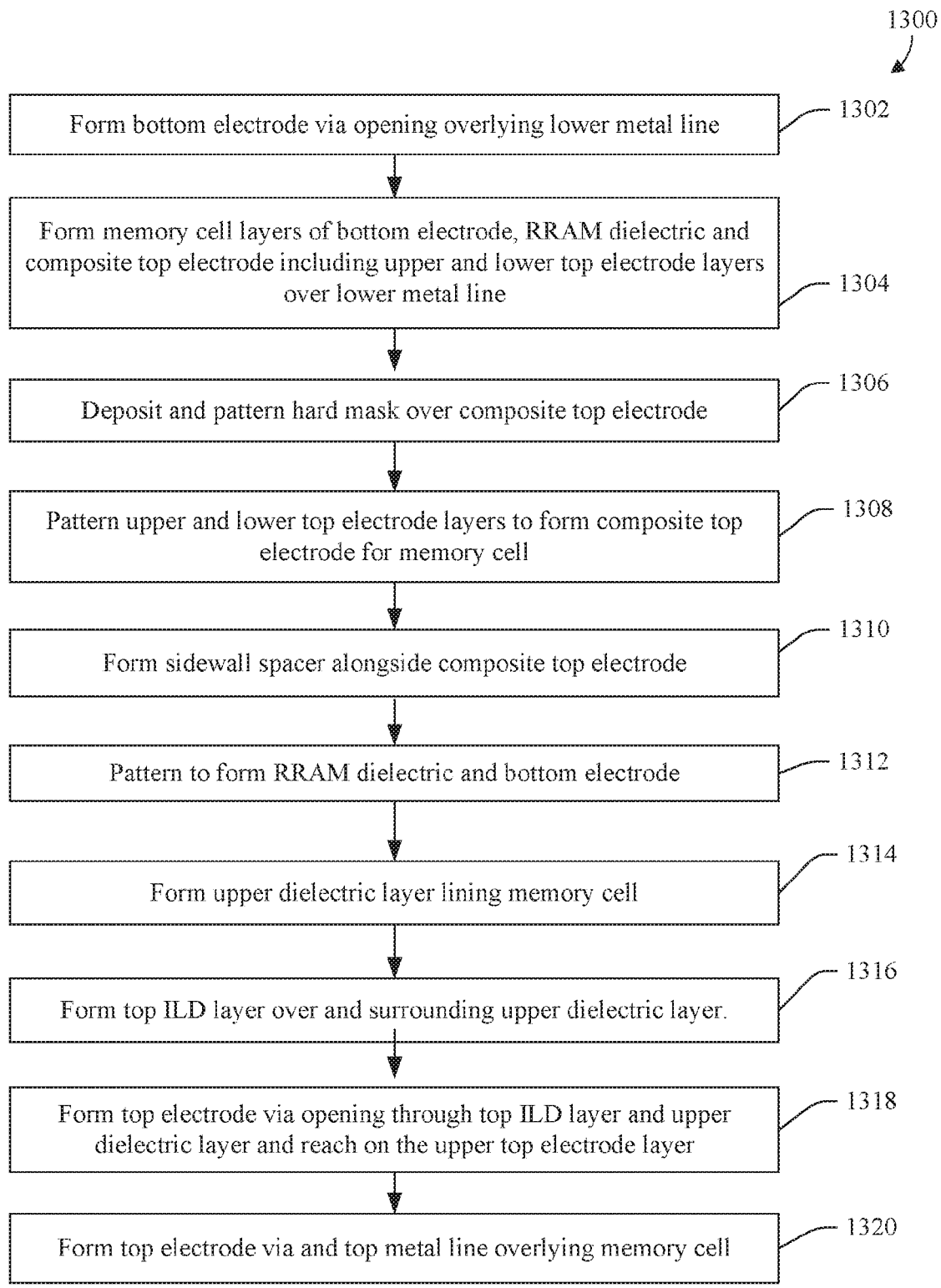
FIG. 13 illustrates a flowchart of some embodiments of a method for manufacturing an integrated circuit with a memory cell.

FIG. 13 shows some embodiments of a flow diagram of a method 1300 of forming a flash memory device. Although method 1300 is described in relation to FIGS. 3-12, it will be appreciated that the method 1300 is not limited to such structures disclosed in FIGS. 3-12, but instead may stand alone independent of the structures disclosed in FIGS. 3-12. Similarly, it will be appreciated that the structures disclosed in FIGS. 3-12 are not limited to the method 1300, but instead may stand alone as structures independent of the method 1300. Also, while disclosed methods (e.g., method 1300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a bottom via opening is formed within a lower dielectric layer overlying a lower interconnect structure. The lower interconnect structure may comprise a bottom metallization line laterally surrounded by a bottom ILD layer. The bottom via opening is formed through the lower dielectric layer to expose the bottom metallization line. FIG. 3 illustrates some embodiments of a cross-sectional view 300 corresponding to act 1302.

At 1304, a multi-layer stack is deposited over the lower dielectric layer 108 by a series of vapor deposition techniques (e.g., physical vapor deposition, chemical vapor deposition, etc.). A bottom electrode via is firstly formed over the lower dielectric layer and filling the bottom via opening. The bottom electrode via may be a titanium nitride layer formed by an atomic layer deposition (ALD) process, followed by a planarization process. Then, layers of a bottom electrode, a switching dielectric, a lower top electrode layer and an upper top electrode layer are formed over the bottom electrode via and the lower dielectric layer in succession. In some embodiments, the lower top electrode layer and the upper top electrode layer are formed by a physical vapor deposition process. For example, the lower top electrode layer can be formed by depositing a TaN layer, and the upper top electrode layer can be formed by depositing a TiN layer thinner than the TaN layer. The upper top electrode layer is formed of more nitrogen than lower top electrode layer such that it is more non-reactive to the air and protects itself from oxidation when exposed. FIG. 4 illustrates some embodiments of a cross-sectional view 400 corresponding to act 1304.

At 1306, a hard mask is formed on the upper top electrode layer. The hard mask can be formed by depositing a dielectric layer followed by a photolithography process for patterning. FIG. 5 illustrates some embodiments of a cross-sectional view 500 corresponding to act 1306.

At 1308, a first etch is performed to pattern the upper top electrode layer, the lower top electrode layer, and the capping layer according to the hard mask. FIG. 6 illustrates some embodiments of a cross-sectional view 600 corresponding to act 1308.

At 1310, a sidewall spacer is formed over the switching dielectric, and lining sidewalls of the capping layer, the composite top electrode, and the hard mask. FIG. 7 illustrates some embodiments of a cross-sectional view 700 corresponding to act 1310.

At 1312, a second etch is performed to pattern the switching dielectric, the bottom electrode, and the bottom electrode via according to the sidewall spacer and the hard mask. FIG. 8 illustrates some embodiments of a cross-sectional view 800 corresponding to act 1312.

At 1314, an upper dielectric layer is formed over the lower dielectric layer, and lining the bottom electrode via, the bottom electrode layer, the switching dielectric, the sidewall spacer, and the hard mask. FIG. 9 illustrates some embodiments of a cross-sectional view 900 corresponding to act 1314.

At 1316, a top ILD layer is formed over and surrounding the upper dielectric layer. FIG. 10 illustrates some embodiments of a cross-sectional view 1000 corresponding to act 1316.

At 1318, a third etch is performed to form a top electrode via opening through the top ILD layer, the upper dielectric layer, and the hard mask and reach on the upper top electrode layer. FIG. 11 illustrates some embodiments of a cross-sectional view 1100 corresponding to act 1318.

At 1320, a conductive layer is formed filling the top electrode via opening and overhanging the top ILD layer to form a top electrode via and a top metallization layer. FIG. 12 illustrates some embodiments of a cross-sectional view 1200 corresponding to act 1320.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, the present disclosure provides a memory cell. A bottom electrode is disposed over a substrate. A switching dielectric having a variable resistance is disposed over the bottom electrode. A capping layer is disposed over the switching dielectric. A composite top electrode is disposed over and abutting the capping layer. The composite top electrode comprises a tantalum nitride (TaN) layer and a titanium nitride (TiN) film disposed directly on the tantalum nitride layer.

In another embodiment, the present disclosure relates to an embedded memory cell. The embedded memory cell comprises a bottom interconnect structure having a bottom metallization line surrounded by a bottom interlayer dielectric (ILD) layer, and a bottom electrode via disposed on the bottom interconnect structure and surrounded by a lower dielectric layer. The embedded memory cell further comprises a bottom electrode electrically connected to the bottom metallization line by the bottom electrode via, and a resistive switching element disposed over the bottom electrode and a capping layer disposed over the resistive switching element. A composite top electrode is disposed over the capping layer, and including a lower top electrode layer and an upper top electrode layer having a smaller thickness than the lower top electrode layer. The upper top electrode layer has a molar ratio of nitrogen greater than that of the lower top electrode layer.

In yet another embodiment, the present disclosure relates to a method of manufacturing an integrated circuit (IC). The method comprises forming a multi-layer stack comprising a bottom electrode layer, a switching dielectric layer over the bottom electrode layer, a capping layer over the switching dielectric layer, a lower top electrode layer over the capping layer, an upper top electrode layer over the lower top electrode layer, and a hard mask over the upper top electrode layer. The upper top electrode layer has a greater nitrogen molar ratio than the lower top electrode layer. The method further comprises performing a first etch to pattern the upper and lower top electrode layers and the capping layer according to the hard mask. The method further comprises forming a sidewall spacer alongside the upper and lower top electrode layers and the capping layer. The method further comprises performing a second etch to pattern the switching dielectric layer and the bottom electrode layer according to the sidewall spacer and the hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory cell, comprising:
a bottom electrode disposed over a substrate;
a switching dielectric disposed over the bottom electrode and having a variable resistance;

a capping layer disposed over the switching dielectric; and a composite top electrode disposed over and abutting the capping layer, wherein the composite top electrode comprises a tantalum nitride (TaN) layer and a titanium nitride (TiN) film disposed directly on the tantalum nitride layer;

wherein the TiN film has a first nitrogen concentration and the TaN layer has a second nitrogen concentration, the first nitrogen concentration being greater than the second nitrogen concentration.

2. The memory cell of claim 1, wherein the TiN film of the composite top electrode has a molar ratio of nitrogen:titanium substantially equal to 1.

3. The memory cell of claim 1, wherein the TaN layer of the composite top electrode has a major portion and an upper portion disposed on the major portion, wherein the major portion has a molar ratio of nitrogen:tantalum being in a range of from about 3:10 to 1:2 and the upper portion has a decreasing molar ratio of nitrogen:tantalum that decreases to substantially zero at a top surface of the upper portion.

4. The memory cell of claim 1, further comprising:
a bottom metallization line coupled to the bottom electrode through a conductive bottom electrode via; and
a top metallization line coupled to the top composite electrode through a top electrode via, the top electrode via comprising a bulk copper having bottom and sidewall surfaces surrounded by a tantalum glue layer or tantalum nitride glue layer.

5. The memory cell of claim 4, wherein the bottom electrode via comprises a lower portion narrower than an upper portion, wherein the upper portion has a sidewall vertically aligned with sidewalls of the bottom electrode and the switching dielectric.

6. The memory cell of claim 5, further comprising:
a hard mask disposed over the composite top electrode; and
a sidewall spacer disposed on an upper surface of the switching dielectric and extended upwardly along the capping layer, the composite top electrode, and the hard mask.

7. The memory cell of claim 6, further comprising:
a lower dielectric layer surrounding the lower portion of the bottom electrode via; and
an upper dielectric layer disposed on the lower dielectric layer and extending along sidewalls of the upper portion of the bottom electrode via, the bottom electrode, the switching dielectric, the sidewall spacer and the hard mask, and further extending on an upper surface of the hard mask.

8. The memory cell of claim 1, wherein sidewalls of the capping layer and sidewalls of the composite top electrode are aligned with one another and not aligned with a sidewall of the bottom electrode.

9. An embedded memory cell, comprising:
a bottom interconnect structure comprising a bottom metallization line surrounded by a bottom interlayer dielectric (ILD) layer;
a bottom electrode via disposed on the bottom interconnect structure and surrounded by a lower dielectric layer;
a bottom electrode electrically connected to the bottom metallization line by the bottom electrode via;
a resistive switching element disposed over the bottom electrode and a capping layer disposed over the resistive switching element; and a composite top electrode disposed over the capping layer, and including a lower TaN top electrode layer and an upper TiN top electrode layer having a smaller thickness than the lower TaN top electrode layer;
wherein the upper TiN top electrode layer has a molar ratio of nitrogen greater than that of the lower TaN top electrode layer.

10. The embedded memory cell of claim 9, further comprising:
a sidewall spacer disposed alongside the capping layer and the composite top electrode; and
an upper dielectric layer disposed on the lower dielectric layer and lining the bottom electrode, the resistive switching element and the sidewall spacer.

11. The embedded memory cell of claim 10, further comprising:
a top electrode via disposed through the upper dielectric layer and electrically connected to the upper TiN top electrode layer of the composite top electrode.

12. The embedded memory cell of claim 11, wherein the top electrode via comprises a bulk copper having bottom and sidewall surfaces surrounded by a tantalum glue layer or tantalum nitride glue layer.

13. The embedded memory cell of claim 9, wherein the lower TaN top electrode layer of the composite top electrode comprises a tantalum nitride layer having a major portion and an upper portion disposed on the major portion, wherein the major portion has a molar ratio of nitrogen:tantalum being in a range of from about 3:10 to 1:2 and the upper portion has a molar ratio of nitrogen:tantalum that decreases to substantially zero at a top surface of the upper portion.

14. The embedded memory cell of claim 9, wherein the lower TaN top electrode layer of the composite top electrode comprises a tantalum nitride layer having a molar ratio of nitrogen:tantalum in a range of from about 3:10 to 1:2.

15. The embedded memory cell of claim 9, wherein the upper TiN top electrode layer of the composite top electrode comprises a titanium nitride layer having a molar ratio of nitrogen:titanium substantially equal to 1.

16. A method for manufacturing a memory cell, the method comprising:
forming a multi-layer stack comprising a bottom electrode layer, a switching dielectric layer over the bottom electrode layer, a capping layer over the switching dielectric layer, a lower TaN top electrode layer over the capping layer, an upper TiN top electrode layer over the lower TaN top electrode layer, and a hard mask over the upper TiN top electrode layer, wherein the upper TiN top electrode layer has a greater nitrogen molar ratio than the lower TaN top electrode layer;
performing a first etch to pattern the upper TiN top electrode layer, the lower TaN top electrode layer, and the capping layer according to the hard mask;
forming a sidewall spacer alongside the upper TiN top electrode layer, the lower TaN top electrode layer, and the capping layer; and
performing a second etch to pattern the switching dielectric layer and the bottom electrode layer according to the sidewall spacer and the hard mask.

17. The method of claim 16, wherein the lower TaN top electrode layer is formed by sputtering a tantalum target to deposit on the capping layer while a nitrogen gas is applied.

18. The method of claim 17, wherein the upper TiN top electrode layer is formed by sputtering a titanium target to deposit on the lower TaN top electrode layer while the nitrogen gas is applied, during which a flow rate of the nitrogen gas is applied at a higher flow rate than during forming the lower TaN top electrode layer.

19. The method of claim 16, wherein the upper TiN top electrode layer is formed to be thinner than the lower TaN top electrode layer.

20. The method of claim 16, further including:
forming an upper dielectric layer lining the bottom electrode layer, the switching dielectric layer, and the sidewall spacer;
forming a top interlayer dielectric (ILD) layer over and around the upper dielectric layer; and
forming a top metallization line over the top ILD layer and a top electrode via extending between the upper TiN top electrode layer and the top metallization line.

* * * * *